(12) United States Patent
Buffet et al.

(10) Patent No.: US 7,038,319 B2
(45) Date of Patent: May 2, 2006

(54) APPARATUS AND METHOD TO REDUCE SIGNAL CROSS-TALK

(75) Inventors: Patrick H. Buffet, Essex Junction, VT (US); Charles S. Chiu, Essex Junction, VT (US); Jon D. Garlett, Poughquag, NY (US); Louis L. Hsu, Fishkill, NY (US); Brian J. Schuh, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/644,372

(22) Filed: Aug. 20, 2003

(65) Prior Publication Data

US 2005/0040536 A1 Feb. 24, 2005

(51) Int. Cl.
*H01L 23/48* (2006.01)
(52) U.S. Cl. .................... 257/773; 257/665; 438/215
(58) Field of Classification Search ............ 257/698, 257/773–774, 778, 781
See application file for complete search history.

(56) References Cited

U.S. PATENT DOCUMENTS

| | | | |
|---|---|---|---|
| 5,499,445 A | 3/1996 | Boyle et al. ............... 29/830 |
| 5,779,503 A | 7/1998 | Tremblay et al. .......... 439/676 |
| 6,215,184 B1 * | 4/2001 | Stearns et al. .............. 257/738 |
| 6,355,978 B1 | 3/2002 | Watanabe ................... 257/700 |
| 6,362,525 B1 | 3/2002 | Rahim ........................ 257/738 |
| 6,369,443 B1 | 4/2002 | Baba .......................... 257/700 |
| 6,373,717 B1 | 4/2002 | Downes, Jr. et al. ....... 361/795 |
| 6,376,906 B1 | 4/2002 | Asai et al. .................. 257/698 |
| 6,479,758 B1 * | 11/2002 | Arima et al. ............... 174/260 |
| 6,657,310 B1 * | 12/2003 | Lin ............................. 257/778 |

* cited by examiner

*Primary Examiner*—Luan Thai
(74) *Attorney, Agent, or Firm*—Sawyer Law Group LLP (57) ABSTRACT

A semiconductor chip package with reduced cross-talk between adjacent signals in a layer of a carrier is disclosed. A first pair of conductors for carrying a first signal is provided in a layer of the carrier. A second pair of conductors for carrying a second signal is provided adjacent to the first pair of conductors in the layer, where the first and second pairs of conductors are configured such that cross-talk between the first and second pairs of conductors is substantially minimized, without increasing the size of the package. The height of the first pair of conductors is shorter than the second pair of conductors. Alternatively, the first and second pairs of conductors are configured so that they evenly affect each other. The chip package thus reduces the cross-talk without compromising the density of the interconnections in the package or resulting in an increase in the size of the package.

9 Claims, 8 Drawing Sheets

APPARATUS AND METHOD TO REDUCE SIGNAL CROSS-TALK

FIELD OF THE INVENTION

The present invention relates to semiconductor chips, and more particularly to semiconductor chip packages.

BACKGROUND OF THE INVENTION

As the number of integrated circuits in electronic systems increases, and the size of the individual devices decreases, the density of interconnections, as well as the number of input/outputs (I/Os), are progressively increased year after year. Accordingly, semiconductor chip package technology are also improved in areas such as capacity, quality and cost. For a package with high-density interconnects and I/Os, cross-talk related signal integrity is a concern. To illustrates this problem, please refer to FIGS. 1, 2A, and 2B.

Figure 1:
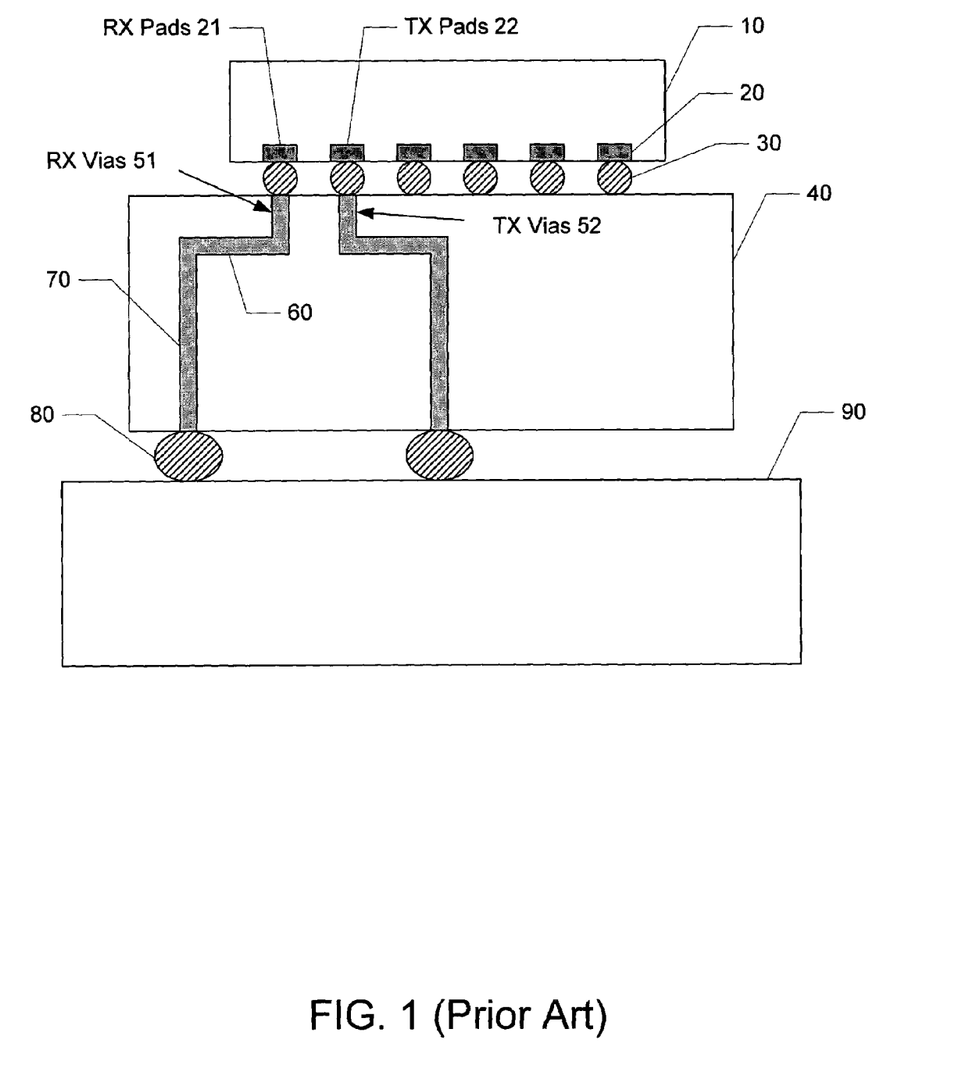
FIG. 1 illustrates a cross-sectional view of a conventional thin-film chip package.

FIG. 1 illustrates a cross-sectional view of a conventional thin-film chip package. The package comprises a semiconductor chip 10 having a plurality of pads 20 and Controlled Collapse Chip Connection (C4) balls 30. The chip 10 is flipped such that the C4 balls 30 are bounded to a carrier 40. The carrier 40 can contain a plurality of conductors to be used for power, ground, and signal interconnection. Each conductor has three sections: a vertical via 51, a trace 60, and a vertical trace 70. The vertical trace 70 can be connected to a module ball 80. Module balls 80 are provided to form contacts between the carrier 40 and a substrate 90. For a multi-layer thin film package carrier 40, depending on the number of layers used in the carrier 40, the height of the via 51 can range from 0.5 to 2.5 mm. The C4 process and technology for high-density packages are well known in the art and will not be described further here.

When the chip 10 uses receivers and transmitters having differential signal pairs, parallel pairs of conductors are used to carry signals. Preferably, any noise that affects the pair of conductors affects one in the same manner as the other. Since the signals carried by the pair of conductors are inversions of each other, the net effect of noise on the carried signal is minimized, realizing a good signal to noise ratio.

For example, assume that the chip 10 comprises a pair of receiver (RX) pads 21 adjacent to a pair of transmission (TX) pads 22. The carrier 40, at the interface with the chip 10, includes a pair of receiver (RX) vias 51 coupled to the RX pads 21 to receive signals from outside the chip 10 to the chip 10, and a pair of transmission (TX) vias 52 coupled to the TX pads 22 to transfer signals from the chip 10 to the outside of the chip 10.

However, as packages become smaller and smaller, the distance between the RX pads 21 and the TX pads 22 become smaller. The distance between the RX vias 51 and the TX vias 52 also become smaller. The signals traveling along the RX vias 51, which have been attenuated by the transmitting media, will be interfered with by the signals carried by the TX vias 52. This is because, the TX vias 52 usually carry stronger signal pulses than the RX vias 51. The cross-talk occurs when the stronger transmitter signal is coupled capacitively and inductively to the weaker receiving signal between the RX pads 21 and TX pads 22, the corresponding C4 balls 30, and the corresponding vias 51 and 52. This cross-talk problem is particularly acute for the vias 51 and 52 near the interface between the chip 10 and the carrier 40.

Figure 2A:
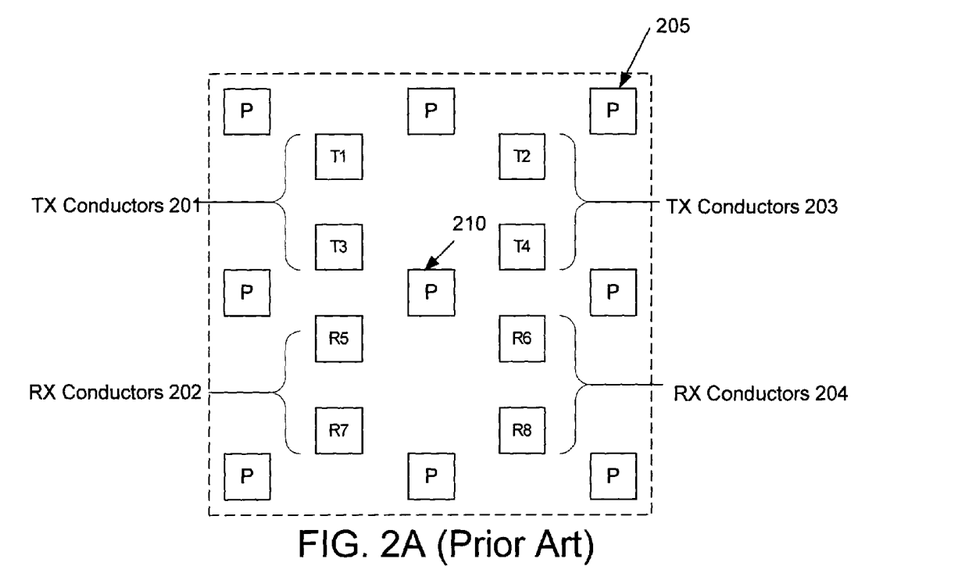
FIGS. 2A and 2B illustrate two example configurations for RX and TX pads in a conventional thin-film chip package.

FIGS. 2A and 2B illustrate two example configurations for RX and TX pads in a conventional thin-film chip package. In FIG. 2A, the carrier 40 near the interface with the chip 10 comprises pairs of TX conductors 201 and 203 adjacent to pairs of RX conductors 202 and 204. Evenly spaced among the conductors is a plurality of power or ground conductors 205 and 210. These power conductors 205 shield TX and RX conductors adjacent to it from the cross-talk effect. For example, RX conductor R5 and TX conductor T4 are shielded by the power conductor 210. However, RX conductor R5 is adjacent to TX conductor T3, but without a power conductor 205 between them. The transmitter signal carried by the TX conductor T3 will couple with the receiver signal carried by RX conductor R5 much more than with the receiver signal carried by RX conductor R7. With this uneven coupling of the signals, the receiver signal pair carried by the RX conductor R5 or R7 will experience cross-talk from the transmitter signal carried by TX conductor T3. Each signal pair is located orthogonally to its adjacent pairs.

Figure 2B:
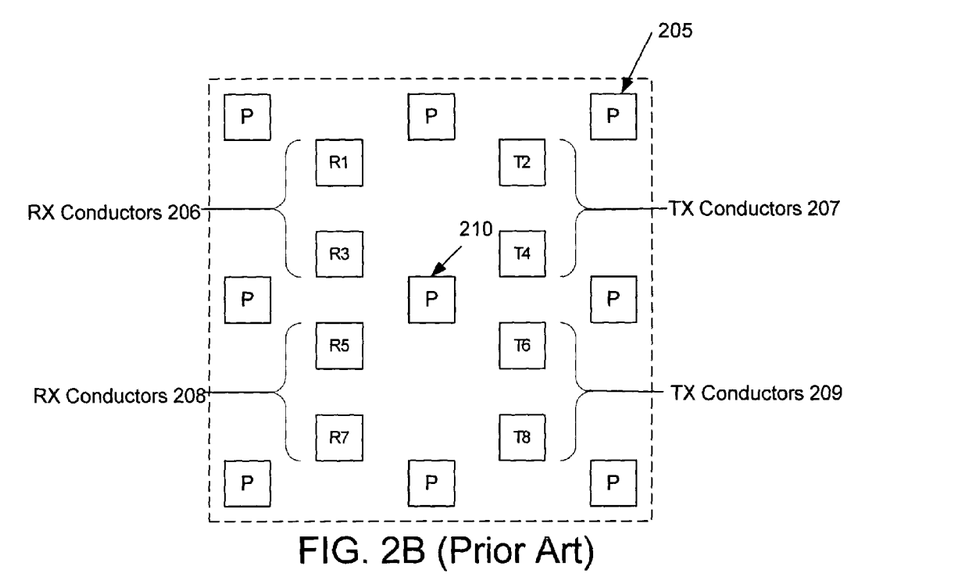

The same is true for RX and TX conductors stacked vertically, as illustrated in FIG. 2B. Two pairs of RX conductors 206 and 208 are each located adjacent to two pairs of TX conductors 207 and 209. Power conductors 205 and 210 are evenly distributed among them. In this case, TX conductors T2 and T4 evenly affects RX conductors R1 and R3. Thus, the net cross-talk effect is substantially reduced. Similarly, TX conductors T6 and T8 evenly affects RX conductors R5 and R7. However, RX conductors R5 and R3 still experience cross-talk from each other, as do TX conductors T6 and T4. The conductor arrangement in FIG. 2B experiences less cross-talk than the conductor arrangement in FIG. 2A, but the cross-talk problem still exists.

Such cross-talk compromises the quality of the signals traversing the package, adversely affecting performance. One conventional approach to this problem is to increase the distance between the conductors. However, this approach reduces the interconnect density of the package, or, if the density is maintained, results in a significantly larger package.

Accordingly, there exists a need for an improved apparatus and method for reducing cross-talk between adjacent signals in a layer of a semiconductor chip package. The improved apparatus and method should reduce the cross-talk without compromising the density of the interconnections or resulting in an increase in the size of the package. The present invention addresses such a need.

SUMMARY OF THE INVENTION

A semiconductor chip package with reduced cross-talk between adjacent signals in a layer of a carrier is disclosed. A first pair of conductors for carrying a first signal is provided in a layer of the carrier. A second pair of conductors for carrying a second signal is provided adjacent to the first pair of conductors in the layer, where the first and second pairs of conductors are configured such that cross-talk between the first and second pairs of conductors is substantially minimized, without increasing the size of the package. The height of the first pair of conductors is shorter than the second pair of conductors. Alternatively, the first and second pairs of conductors are configured so that they evenly affect each other. The chip package thus reduces the cross-talk without compromising the density of the interconnections in the package or resulting in an increase in the size of the package.

DETAILED DESCRIPTION

The present invention provides an improved apparatus and method for reducing cross-talk between adjacent signals in a layer of a semiconductor chip package. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

To more particularly describe the features of the present invention, please refer to FIGS. 3 through 8 in conjunction with the discussion below.

Figure 3:
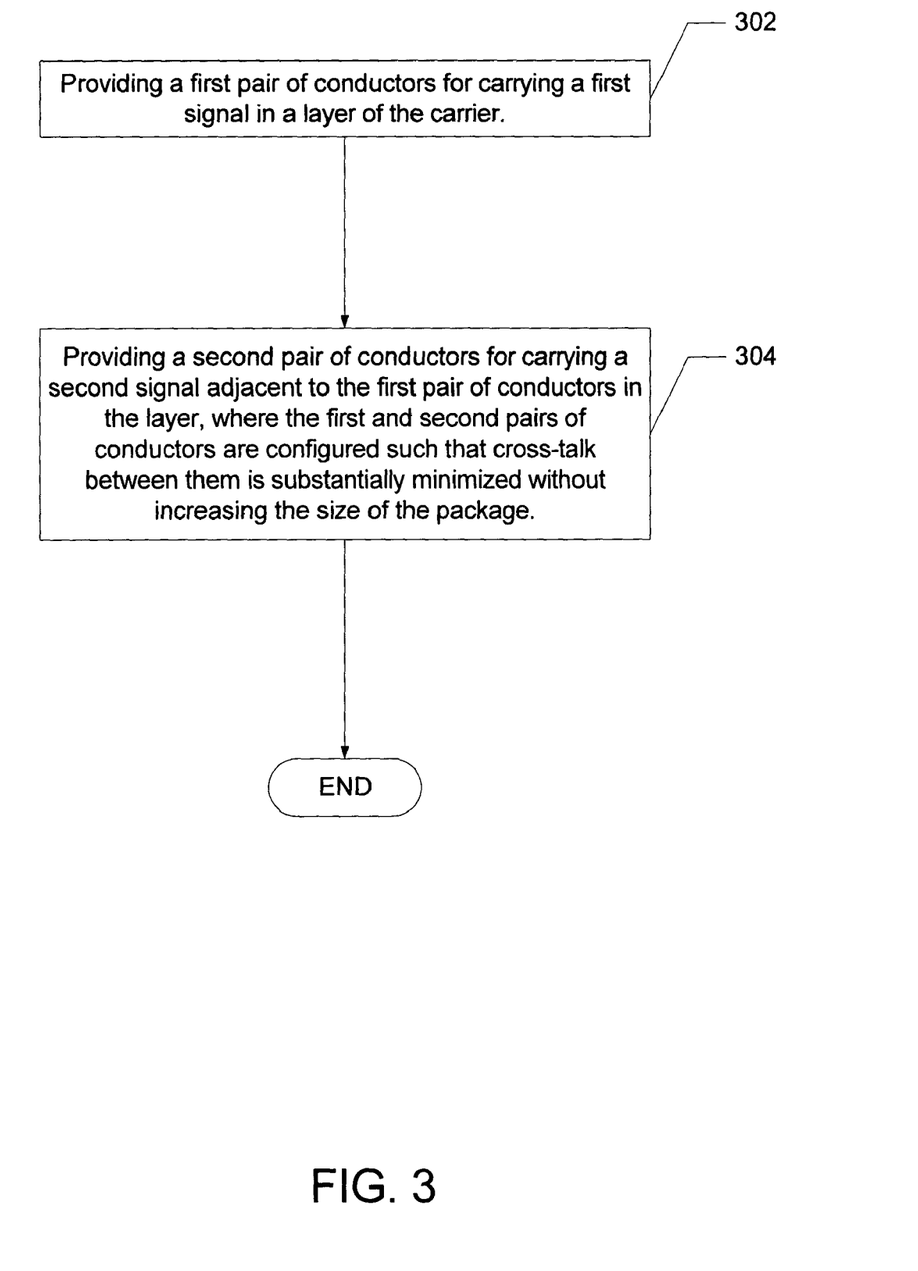
FIG. 3 is a flowchart illustrating a preferred embodiment of a method for reducing cross-talk between adjacent signals in a layer of a semiconductor chip package in accordance with the present invention.

FIG. 3 is a flowchart illustrating a preferred embodiment of a method for reducing cross-talk between adjacent signals in a layer of a semiconductor chip package in accordance with the present invention. First, a first pair of conductors for carrying a first signal is provided in a layer of the carrier of a semiconductor chip package, via step 302. Then, a second pair of conductors for carrying a second signal in the layer is provided adjacent to the first pair of conductors, where the first and second pairs of conductors are configured such that cross-talk between them is substantially minimized, without increasing the size of the package, via step 304.

Figure 4:
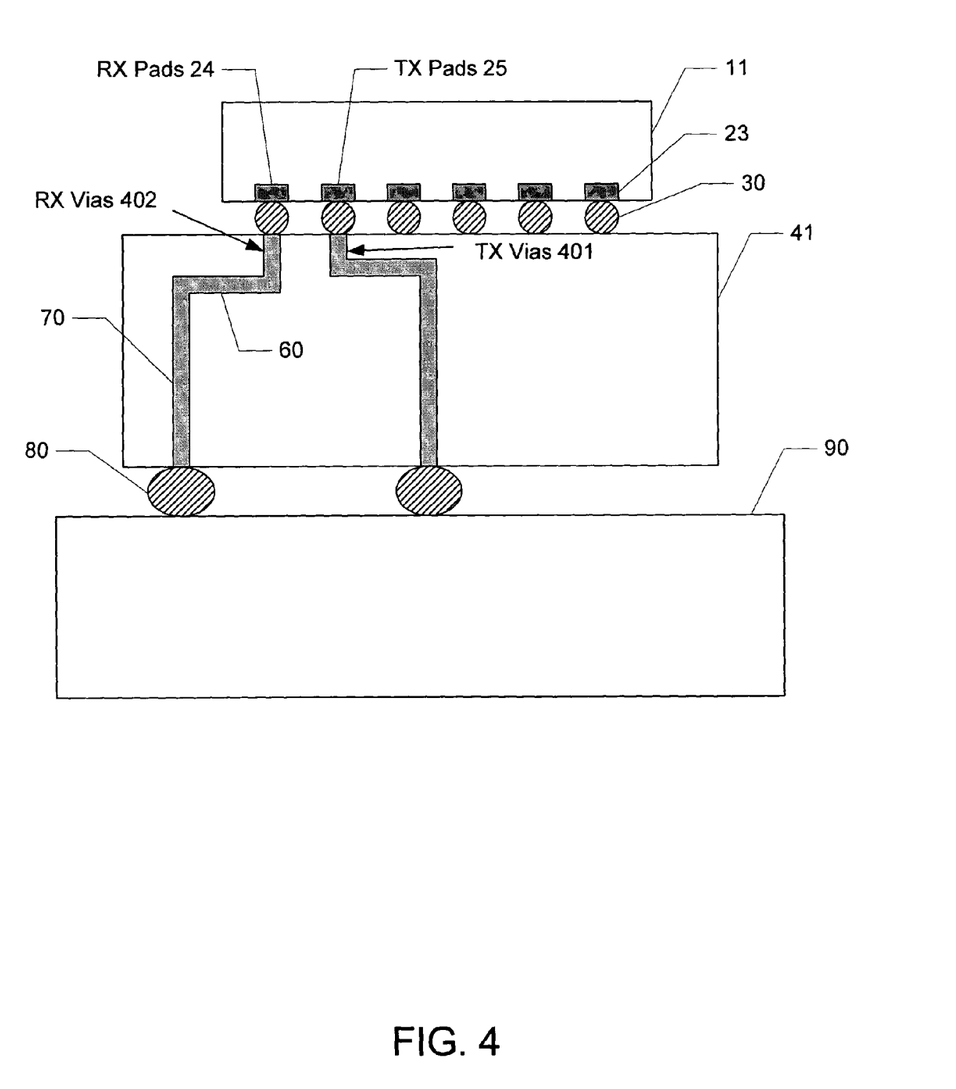
FIG. 4 illustrates a vertical cross-sectional view of a first preferred embodiment of a configuration of the first and second pairs of conductors in accordance with the method of the present invention.
Figure 5A:
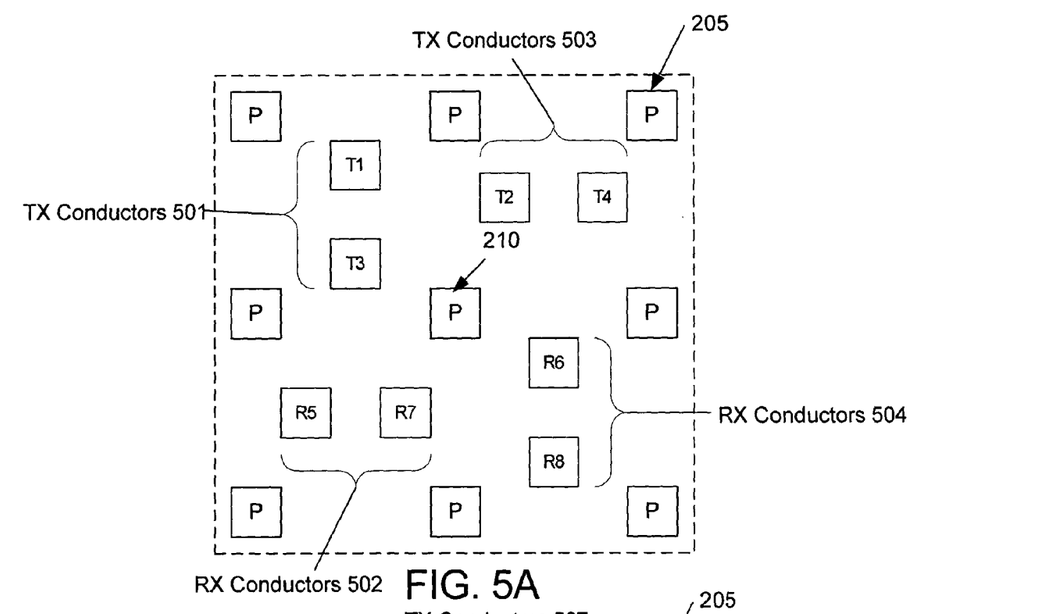
FIGS. 5A and 5B illustrate a horizontal cross-sectional view of a second embodiment of a configuration of the first and second pairs of conductors in accordance with the method of the present invention.
Figure 5B:
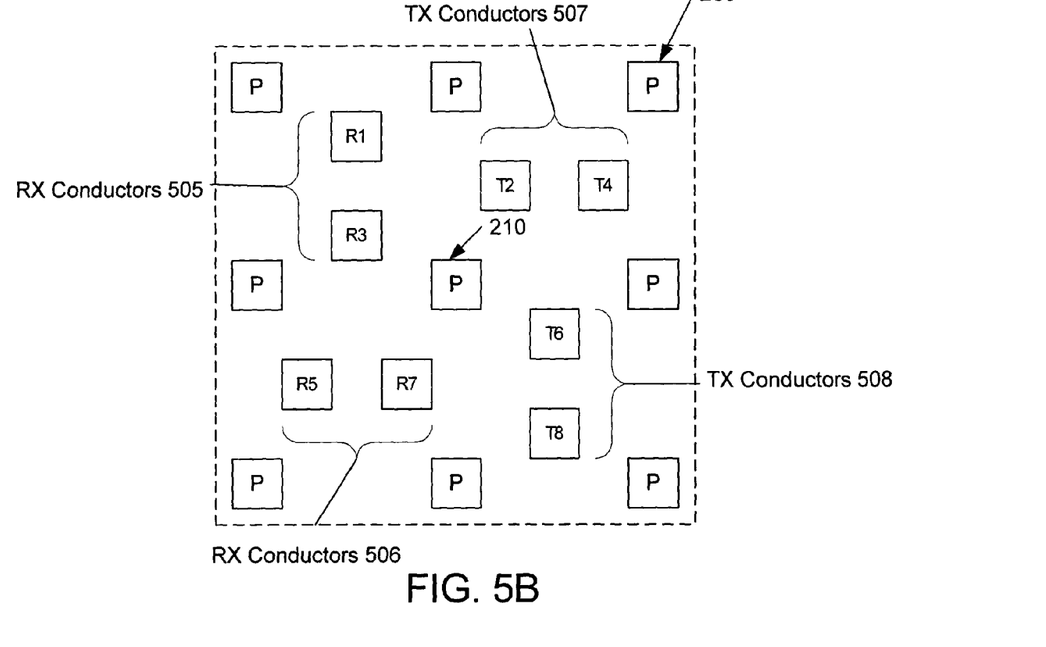

FIG. 4 illustrates a vertical cross-sectional view of a first preferred embodiment of a configuration of the first and second pairs of conductors in accordance with the method of the present invention. FIGS. 5A and 5B illustrate a horizontal cross-sectional view of a second embodiment of a configuration of the first and second pairs of conductors in accordance with the method of the present invention. The first and second preferred embodiments can be used separately or in combination.

Referring first to FIG. 4, a pair of RX vias 402 is coupled to a pair of RX pads 24 in the chip 11, and a pair of TX vias 401 is coupled to a pair of TX pads 25 in the chip 11. In the first preferred embodiment, either the RX vias 402 or the TX vias 401 in a layer of the carrier 41 near the interface with the chip 11 is significantly shorter than the other. For the package illustrated in FIG. 4, the TX vias 401 is significantly shorter than the RX vias 402. Alternatively, the RX vias 402 can be shorter than the TX vias 401. This difference in height of the adjacent vias substantially minimizes the cross-talk between them. In the first preferred embodiment, the height of both vias within a pair is shortened, so that noise due to loading mismatch can be avoided.

Also in the first preferred embodiment, if the height of the TX vias 401 is shortened in one layer of the carrier 41, the height of the RX vias 402 is shortened in an adjacent layer of the carrier 41. This is to maintain proper overall layer heights. However, the heights can be shortened in other manners without departing from the spirit and scope of the present invention.

Referring now to FIGS. 5A and 5B, in a second preferred embodiment, the position of the conductors in the layer of the carrier 41 are such that the conductors evenly affect each other. In this manner, cross-talk among critical signals is essentially eliminated. FIG. 5A illustrates a first example conductor configuration in a layer of the carrier 41 in accordance with the present invention. The pair of RX conductors 502 is positioned so that the TX conductor T3 evenly affects RX conductors R5 and R7. The pair of TX conductors 503 is also positioned so that the TX conductor T2 evenly affects TX conductors T1 and T3. Similarly, the RX conductor R6 is evenly affected by TX conductors T2 and T4, and the RX conductor R7 is evenly affected by RX conductors R6 and R8. The pairs of conductors is positioned orthogonally to each other. With this conductor configuration, cross-talk between adjacent conductors is substantially minimized without increasing the size of the package.

FIG. 5B illustrates a second example conductor configuration in a layer of the carrier 41 in accordance with the present invention. The pair of RX conductors 505 are positioned so that the RX conductor R3 is evenly affected by RX conductors R5 and R7. A pair of TX conductors 507 are also positioned so that the TX conductor T2 evenly affects RX conductors R1 and R3. Similarly, the TX conductor T6 evenly affects TX conductors T2 and T4, and the RX conductor R7 is evenly affected by TX conductors T6 and T8. With this conductor configuration, cross-talk between adjacent conductors is also substantially minimized without increasing the size of the package. The same type of configuration can be repeated in the layers of conductors above and below the illustrated layers of the carrier 41. In short, to cancel out the cross-talks between adjacent conductors, each aggressor signal is kept at an equal distance to a pair of differential victim signals, or, a differential aggressor signal pair an equal distance to a victim signal.

Although the preferred embodiments have been described above in the context of conductors within layers of a carrier, one of ordinary skill in the art will understand that the concepts of the present invention can also be applied to conductors in connectors coupled to the package without departing from the spirit and scope of the present invention. The present invention as applied to connectors is described further below with reference to FIGS. 6A through 8.

Figure 6A:
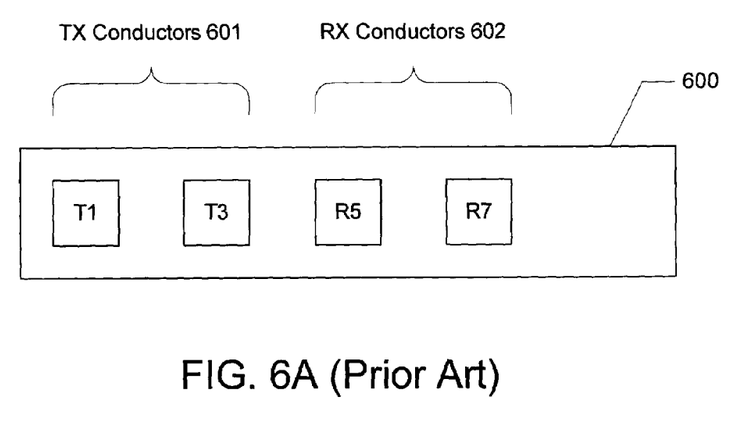
FIGS. 6A and 6B illustrate conventional connectors.
Figure 6B:
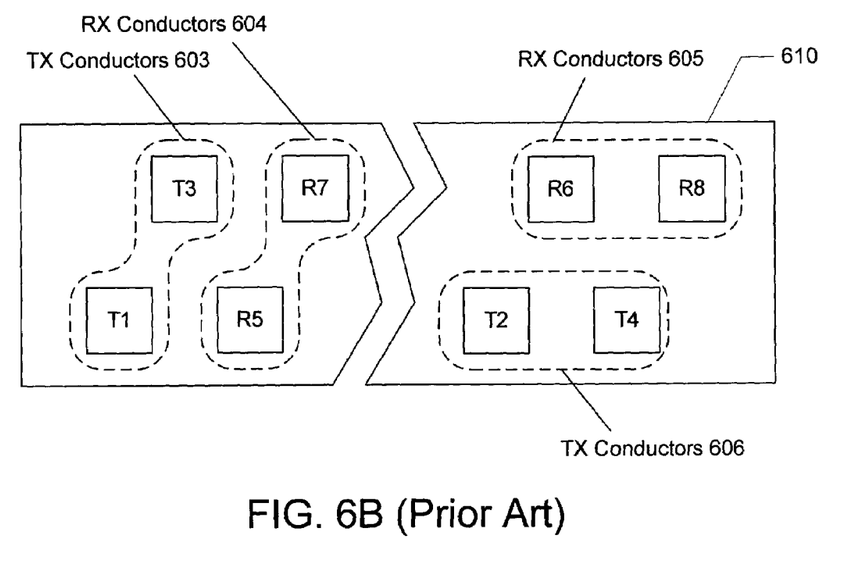

FIGS. 6A and 6B illustrate conventional connectors. These connectors can couple to the substrate 90 to carry signals outside of the package. The problem of cross-talk between adjacent conductors exist here as in the carrier 40 described above. FIG. 6A illustrates a connector 600 comprising a pair of TX conductors 601 adjacent to a pair of RX conductors 602, configured as shown. As with the conductors in the carrier 40, TX conductor T3 will affect RX conductor R5 more than RX conductor R7, resulting in cross-talk. FIG. 6B illustrates a connector 610 comprising a different configuration of a pair of TX conductors 603 adjacent to a pair of RX conductors 604, and a pair of RX conductors 605 adjacent to a pair of TX conductors 606. Here, TX conductor T1 will have a greater effect on RX conductor R5 than on RX conductor R7, and TX conductor T2 will have a greater effect on RX conductor R6 than on RX conductor R8, resulting in cross-talk in both situations. For conductors in connectors, where the signals are closely packed and not shielded, and not designed to be noise-proof, conventional methods of reducing cross-talk, such as applying a twist to the conductors, are not effective. Coupling between the conductors would still occur.

Figure 7:
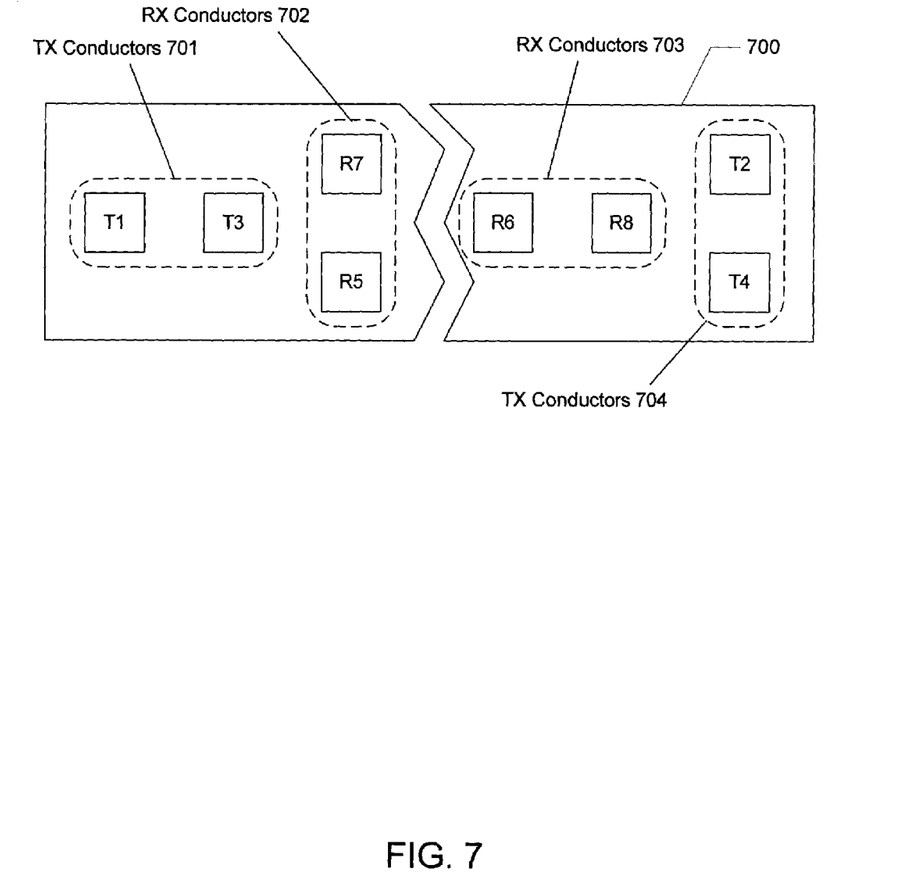
FIG. 7 illustrates a first example conductor configuration in a connector in accordance with the present invention.

To effectively solve the cross-talk problem, the conductors in the connectors can be positioned according to the second preferred embodiment in accordance with the present invention. FIG. 7 illustrates a first example conductor configuration in a connector in accordance with the present invention. The TX conductors 701 and RX conductors 702 are positioned so that the TX conductor T3 evenly affects RX conductors R5 and R7. Similarly, RX conductors 703 and TX conductors 704 are positioned so that the RX conductor R8 is evenly affected by TX conductors T2 and T4. With this conductor configuration, cross-talk between adjacent conductors is substantially minimized without increasing the size of the connector.

Figure 8:
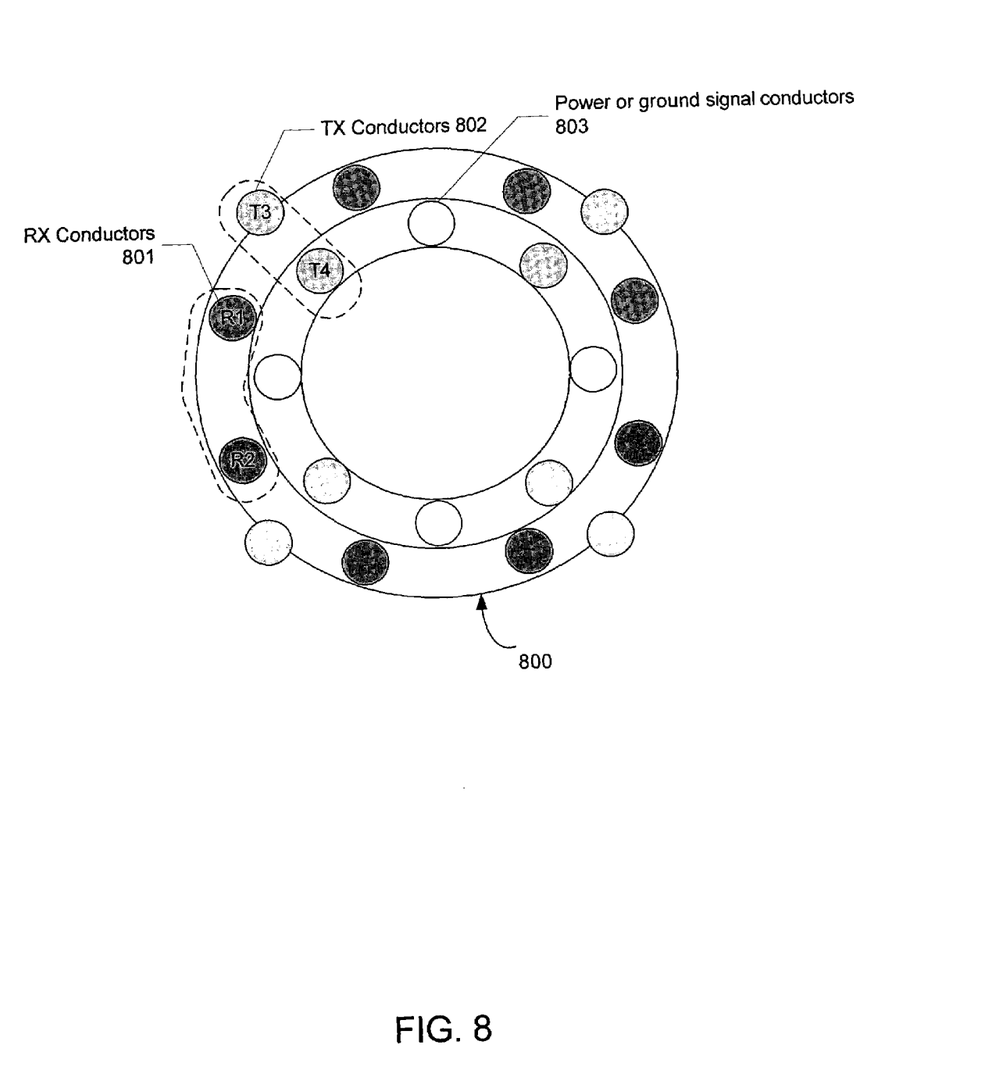
FIG. 8 illustrates a second example conductor configuration in a connector in accordance with the present invention.

FIG. 8 illustrates a second example conductor configuration in a connector in accordance with the present invention. The conductors in connector 800 are configured in a circular manner, but also such that cross-talk among critical signals is essentially eliminated. For example, the TX conductor 802 are adjacent to RX conductor 801, with the RX conductor R1 being evenly affected by TX conductors T3 and T4. With this conductor configuration, cross-talk between adjacent conductors is also minimized without increasing the size of the connector.

An improved apparatus and method for reducing cross-talk between adjacent signals in a layer of a semiconductor chip package has been disclosed. A first pair of conductors for carrying a first signal is provided in a layer of the carrier. A second pair of conductors for carrying a second signal is provided adjacent to the first pair of conductors in the layer, where the first and second pairs of conductors are configured such that cross-talk between the first and second pairs of conductors is substantially minimized, without increasing the size of the package. In the first preferred embodiment, the height of one pair of conductors is significantly less than its adjacent pair, resulting in significantly reduced cross-talk. In the second preferred embodiment, the conductors in the layer of the carrier are configured so that they evenly affect each other, also resulting in significantly reduced cross-talk. The present invention thus reduces the cross-talk without compromising the density of the interconnections in the package or resulting in an increase in the size of the package The present invention is also applicable to cross-talk between conductors in connectors.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A multi-layer semiconductor chip package, comprising:

a plurality of pairs of conductors for carrying a plurality of signals in a layer of a carrier of the package, the plurality of pairs of conductors including a first pair of conductors to carry aggressor signals and a second pair of conductors adjacent to the first pair of conductors, the second pair of conductors to carry victim signals affected by the aggressor signals;

wherein each pair of conductors in the layer is positioned so that adjacent pairs of conductors affect each other evenly such that each aggressor signal of the first pair of conductors is respectively equidistant to both the victim signals of the second pair of conductors and each victim signal of the second pair of conductor is respectively equidistant to both the aggressor signals of the first pair of conductors, wherein cross-talk between the adjacent pairs of conductors is substantially minimized without increasing a size of the package.

2. The package of claim 1, wherein the adjacent pairs of conductors are positioned orthogonally to each other.

3. The package of claim 1, wherein the adjacent pairs of conductors are positioned to be equidistant to each other.

4. The package of claim 1, wherein the layer is near an interface between the carrier and a chip.

5. A connector capable of being coupled to a semiconductor chip package, comprising:

a plurality of pairs of conductors for carrying a plurality of signals in a layer of a carrier of the package, the plurality of pairs of conductors including a first pair of conductors to carry aggressor signals and a second pair of conductors adjacent to the first pair of conductors, the second pair of conductors to carry victim signals affected by the aggressor signals;

wherein each pair of conductors in the layer is positioned so that adjacent pairs of conductors affect each other evenly such that each aggressor signal of the first pair of conductors is respectively equidistant to both the victim signals of the second pair of conductors and each victim signal of the second pair of conductor is respectively equidistant to both the aggressor signals of the first pair of conductors, wherein cross-talk between the adjacent pairs of conductors is substantially minimized without increasing a size of the package.

6. The package of claim 5, wherein the adjacent pairs of conductors are positioned to be equidistant to each other.

7. A method for providing a semiconductor chip package, comprising the steps of:

providing a plurality of pairs of conductors for carrying a plurality of signals in a layer of a carrier of the package, the plurality of pairs of conductors including a first pair of conductors to carry aggressor signals and a second pair of conductors adjacent to the first pair of conductors, the second pair of conductors to carry victim signals affected by the aggressor signals;

wherein each pair of conductors in the layer is positioned so that adjacent pairs of conductors affect each other evenly such that each aggressor signal of the first pair of conductors is respectively equidistant to both the victim signals of the second pair of conductors and each victim signal of the second pair of conductor is respectively equidistant to both the aggressor signals of the first pair of conductors, wherein cross-talk between the adjacent pairs of conductors is substantially minimized without increasing a size of the package.

8. The method of claim 7, wherein the adjacent pairs of conductors are positioned to be equidistant to each other.

9. The method of claim 7, wherein the layer is near an interface between the carrier and a chip.

* * * * *